(12) United States Patent
Hemberg et al.

(10) Patent No.: US 9,530,607 B2
(45) Date of Patent: Dec. 27, 2016

(54) SUPPLY OF A LIQUID-METAL TARGET IN X-RAY GENERATION

(71) Applicant: EXCILLUM AB, Kista (SE)

(72) Inventors: Oscar Hemberg, Stockholm (SE); Tomi Tuohimaa, Stockholm (SE); Mikael Otendal, Stockholm (SE)

(73) Assignee: EXCILLUM AB, Kista (SE)

( * ) Notice: Subject to any disclaimer, the term of this patent is extended or adjusted under 35 U.S.C. 154(b) by 0 days.

(21) Appl. No.: 14/457,385

(22) Filed: Aug. 12, 2014

(65) Prior Publication Data

US 2014/0348302 A1 Nov. 27, 2014

Related U.S. Application Data

(63) Continuation of application No. 13/262,499, filed as application No. PCT/EP2009/002464 on Apr. 3, 2009, now Pat. No. 8,837,679.

(51) Int. Cl.
*H01J 35/02* (2006.01)
*H01J 35/08* (2006.01)
(Continued)

(52) U.S. Cl.
CPC .......... *H01J 35/08* (2013.01); *G03F 7/70033* (2013.01); *H01J 35/12* (2013.01); *H05G 2/003* (2013.01);
(Continued)

(58) Field of Classification Search
CPC ...... H01J 35/14; H01J 35/16; H01J 2235/086; H01J 2235/081; H01J 35/12; H01J 35/02; H01J 2235/082; H01J 2235/1262; H01J 2235/12
(Continued)

(56) References Cited

U.S. PATENT DOCUMENTS 4,953,191 A    8/1990  Smither et al.
5,991,360 A *  11/1999 Matsui et al. ............... 378/119
(Continued)

FOREIGN PATENT DOCUMENTS

WO    WO 02/11499 A1    2/2002

OTHER PUBLICATIONS

International Search Report (PCT/ISA/210) issued on Dec. 4, 2009, by European Patent Office as the International Searching Authority for International Application No. PCT/EP2009/002464.
(Continued)

*Primary Examiner* — Hoon Song
(74) *Attorney, Agent, or Firm* — Buchanan Ingersoll & Rooney, P.C.

(57) ABSTRACT

Closed-loop circulation for providing liquid metal to an interaction region at which an electron beam is to impact upon the liquid metal to produce X-rays is presented. In a method, the pressure of the liquid metal is raised to at least 10 bar using a high-pressure pump. The pressurized liquid metal is then conducted to a nozzle and ejected into a vacuum chamber in the form of a spatially continuous jet. After passage through the vacuum chamber, the liquid metal is collected in a collection reservoir, and the pressure of the liquid metal is raised to an inlet pressure, e.g. using a primer pump, suitable for the inlet of the high-pressure pump. Also, a corresponding circulation system and an X-ray source provided with such circulation system.

13 Claims, 5 Drawing Sheets

(51) Int. Cl.
   *G03F 7/20*   (2006.01)
   *H01J 35/12*  (2006.01)
   *H05G 2/00*   (2006.01)
(52) U.S. Cl.
   CPC ......... *H05G 2/008* (2013.01); *H01J 2235/082* (2013.01); *H01J 2235/1204* (2013.01); *H01J 2235/1279* (2013.01)
(58) Field of Classification Search
   USPC ................................ 378/143, 123, 119, 125
   See application file for complete search history.

(56) References Cited

U.S. PATENT DOCUMENTS

| | | | |
|---|---|---|---|
| 2002/0015473 A1* | 2/2002 | Hertz et al. .................... | 378/143 |
| 2007/0269341 A1* | 11/2007 | Halverson ................ | G01N 1/34 |
| | | | 422/400 |
| 2008/0092734 A1* | 4/2008 | Benner ................. | B01D 45/16 |
| | | | 95/26 |
| 2008/0121379 A1* | 5/2008 | Bidon et al. .................. | 165/110 |
| 2011/0299158 A1* | 12/2011 | Alessi .................... | G02B 21/34 |
| | | | 359/395 |

OTHER PUBLICATIONS

Hemberg, O. et al., "Liquid-metal-jet anode electron-impact x-ray source," Applied Physics Letters, Aug. 18, 2003, vol. 83, No. 7, pp. 1483-1485.

* cited by examiner

SUPPLY OF A LIQUID-METAL TARGET IN X-RAY GENERATION

CROSS REFERENCE TO RELATED APPLICATIONS

The present application is a continuation of U.S. application Ser. No. 13/262,499, filed on Nov. 15, 2011, which is a U.S. National Stage of International Application No. PCT/EP2009/002464, filed on Apr. 3, 2009. The entire contents of each of U.S. application Ser. No. 13/262,499 and International Application No. PCT/EP2009/002464 are hereby incorporated herein by reference in their entirety.

TECHNICAL FIELD

The present disclosure generally relates to liquid-metal targets, particularly for use in electron impact X-ray sources.

TECHNICAL BACKGROUND

X-rays have traditionally been generated by letting an electron beam impact upon a solid anode target. However, thermal effects in the anode limit the performance of the X-ray source. One way of mitigating the problems relating to overheating of the solid anode target has been to use a rotating solid anode.

A second conventional approach is to direct the electron beam towards a liquid anode target, such as in the form of freely falling droplet or stream. U.S. Pat. No. 4,953,191 shows an X-ray source using as its anode a falling stream of liquid gallium, which is substantially flat and typically has a tangential velocity of about 2.0 m/s. In view of overheating, the power of an X-ray source of this type will be limited by the mass of gallium transported per unit time by the flowing stream. Spatial localization is typically a desirable property of the source, and neither thickening the stream nor increasing its speed are available as ways to increase the mass flow.

More recently, it has been proposed to use a liquid jet as electron target in X-ray generation. For example, WO 02/11499 discloses a method and apparatus for generating X-ray or EUV radiation using a liquid jet as a target for an electron beam. Such X-ray sources may comprise a grounded jet of liquid metal adapted to act as anode, i.e., as target for the electron beam. By virtue of its regenerative nature, such jet of liquid metal can withstand strong electron beam impact; as a comparison, the propagation speed of the jet can be similar to or higher than the tangential speed of a conventional rotating anode. Although only a fraction of the energy carried by the electron beam is converted into X-ray energy—which leads to a considerable excess heat generation—these liquid jet X-ray sources are nevertheless characterized by excellent brightness, which brings benefits relating to exposure duration, spatial resolution and new imaging methods, such as phase-contrast imaging.

However, it has been a challenge to devise a liquid metal jet X-ray source that can operate for extended periods of time without interruptions for maintenance. For example, in previous X-ray sources of this kind, an operator has been required to halt the generation of X-rays in order to change or refill a target supply container, or to change or refill containers for pressurized propellant gas that is used for generating the target jet.

SUMMARY

A general object of the present invention is to provide a closed-loop system for supply of liquid metal to an interaction region where an electron beam impacts the liquid metal to generate X-rays. It is envisaged that the present invention will provide prolonged operational times before X-ray generation must be interrupted for maintenance or service.

By way of introduction, the context and some challenges relating to systems for supply of a liquid metal jet will be briefly discussed.

An X-ray source of the mentioned type includes an electron gun and a system for providing a steady jet of liquid metal inside a vacuum chamber. The metal used is preferably one having a comparably low melting point, such as indium, gallium, tin, lead, bismuth or an alloy thereof. The electron gun may function by the principle of cold-field emission, thermal-field emission, thermionic emission and the like. The system for providing the electron-impact target, i.e. the liquid-metal jet, may include a heater and/or a cooler, a pressurizing means, a jet nozzle and a reservoir for collecting the liquid metal at the end of the jet. X-ray radiation is generated in the impact region as a result of the interaction of the electrons and the liquid-metal target. A window having suitable transmission characteristics allows the X rays thus generated to leave the low-pressure chamber. To allow continuous operation of the device, it is desirable to recover the liquid metal downstream from the interaction region and to reuse the recovered liquid metal in a closed-loop fashion.

On a technological level, supply of the liquid-metal jet in a closed-loop manner has been found to entail potential weaknesses. The uniformity of the jet, in terms of speed, shape and thickness, may be dissatisfactory due to pressure variations caused by, e.g., the movement of pump pistons, intermittent mechanical obstruction by solid contaminant contained in the liquid, fluctuations of liquid levels in various parts of the system, and even loss of suction capacity of the pump. Under some conditions, the jet may also become spatially discontinuous and break up into segments or droplets before a point where the electron beam impacts upon the jet, which would lead to complications with respect to the X-ray generation.

Leakage of metal is another potential challenge of a closed-loop system for providing the liquid-metal jet. The result of leakage may be that metal is permanently lost to the exterior of the system, but also includes the case of metal solidifying in parts of the system that are inaccessible. For example, a mist of suspended liquid droplets may be produced at the exit of the nozzle and at the point where the liquid jet impacts the liquid contained in the collecting receptacle. If such mist, which is relatively mobile, deposits on an inner wall of the low-pressure chamber, it will be more or less permanently lost from the circulation. Moreover, if the low-pressure chamber is a pumped vacuum chamber adapted to continuously evacuate gaseous or gas-suspended particles therein, an amount of liquid may be expelled from the system this way. Finally, seals, piping and pumps are all sources of potential leakage of liquid and therefore weak points of the circulation loop. From a user's point of view, leakage may release potentially toxic gas, necessitate expensive replenishment of liquid, shorten maintenance intervals (particularly the periods between cleaning of the X-ray output window), deteriorate performance by spoiling the vacuum conditions, and generally make operation of the associated X-ray source more difficult for continuous periods of time. These challenges are addressed and mitigated by the present invention.

Proposed herein, in accordance with a first aspect of the invention, is therefore a method for closed-loop supply of liquid metal to an interaction region, in which an electron beam is to impact upon the liquid metal to generate X rays, particularly by bremsstrahlung or characteristic line emission. The method comprises the following steps:

The pressure of liquid metal contained in a first portion of a closed-loop circulation system is raised to at least 10 bar, preferably at least 50 bar or more, using a high-pressure pump.

The pressurized liquid metal is conducted to a nozzle. Although any conduction through a conduit will entail some, possibly negligible under the circumstances, loss of pressure, the pressurized liquid metal reaches the nozzle at a pressure still above 10 bar, preferably above 50 bar.

The liquid metal is ejected from the nozzle into a vacuum chamber, in which the interaction region is located, for generating a liquid metal jet.

The ejected liquid metal is collected in a collection reservoir after passage through the interaction region.

The pressure of the collected liquid metal is raised to a suction side pressure (inlet pressure) for the high-pressure pump, in a second portion of the closed-loop circulation system located between the collection reservoir and the high-pressure pump in the flow direction (i.e., during normal operation of the system, liquid metal flows from the collection reservoir towards the high-pressure pump). The inlet pressure for the high-pressure pump is at least 0.1 bar, preferably at least 0.2 bar, in order to provide reliable and stable operation of the high-pressure pump.

The steps are then typically repeated continuously—that is, the liquid metal at the inlet pressure is again fed to the high-pressure pump which again pressurizes it to at least 10 bar etc.—so that the supply of a liquid metal jet to the interaction region is effected in a continuous, closed-loop fashion.

The high-pressure pump used for pressurizing the liquid metal in the high-pressure portion of the circulation loop comprises dedicated high-pressure elements, so as to allow a considerable pressure difference between its suction side and discharge side. The pump may in particular be of a sealless type, in order to reduce the risk of leakage. Dynamic seals, such as sliding seals or rotary seals, are indeed known to be particularly sensitive to leaks at high pressures. This could cause both pressure fluctuations (since the tightness of a dynamic seal may vary with its actual position) and a steady escape of liquid. In the context of the present invention, sealless pumps, such as diaphragm pumps, are preferred over pumps having dynamic seals.

The step of raising the pressure of the collected liquid metal to a sufficient inlet pressure ensures good operating conditions for the high-pressure pump, enabling it to supply a steady high pressure to the nozzle and protecting it from losing its suction capacity. Preferably, the propagation speed of the liquid-metal jet through the vacuum chamber is at least 10 m/s. The liquid metal jet is generated so that the jet will be spatially continuous at the point where the electron beam impacts the metal jet. It is noted, however, that breakup of the jet beyond the point where the electron beam impacts the target jet is generally acceptable since such late breakup of the jet does not affect the generation of X-rays to any relevant extent; the possibility of such breakup does not influence the dimensioning of the nozzle.

The raising of the liquid metal pressure from vacuum pressure up to the inlet pressure may be achieved passively using the gravitational field by collecting the ejected liquid in a reservoir having such placement that a column of liquid metal at its bottom sup-plies a hydrostatic pressure of suitable magnitude to the suction side of the high-pressure pump, at least during operation. Alternatively, the reservoir may be essentially flat but be connected to the high-pressure pump via a liquid-filled (during operation) duct extending down in the gravitational field. Hence, in relation to the collection reservoir, the high-pressure pump should in this case be located lower in the gravitational field, and at least part of the connection between these (in the flow direction) should contain liquid metal during steady-state operation that provides a sufficient inlet pressure for the high-pressure pump.

Sufficient inlet pressure may also be provided actively, e.g. by means of a primer pump arranged between the collection reservoir and the high-pressure pump, for providing pressurized liquid metal to the suction side of the latter.

It will also be understood that the inlet pressure for the high-pressure pump can be obtained using a combination of the gravitational field and a primer pump.

As explained earlier, the X-ray generation process produces a considerable amount of excess heat. A high temperature may accelerate corrosion and other types of deterioration of the system. In order to remove the excess heat from the liquid metal there may be provided a cooler, such as a refrigerating coil thermally connected to the collection reservoir, adapted to discharge excess heat delivered by the electron beam to the outside the circulation system. Such cooler may be operated at a rate proportionate to the actual intensity of the electron beam with an aim of maintaining the liquid metal contained in the circulation system at a moderate set-point temperature, such as slightly above the melting point for the metal at issue. It should be understood, however, that the temperature of the liquid metal will vary through the different portions of the closed-loop circulation system.

More generally, a temperature control may be applied. Apart from removing excess heat generated by electron bombardment to avoid corrosion and overheating of sensitive components in the system, there may be a need for heating the liquid metal in other portions of the system. Heating may be required if a metal with a high melting point is used and the heat power supplied by the electron beam is not sufficient to maintain the metal in its liquid state throughout the system. As a particular inconvenience, if the temperature falls below a critical level, splashes of liquid metal hitting portions of the inner wall of the collection reservoir may solidify and be lost from the liquid circulation loop of the system. Heating may also be required if a large outward heat flow takes place during operation, e.g., if it turns out to be difficult to thermally insulate some section of the system. It should also be understood that heating for start-up may be required if the metal used is not liquid at typical ambient temperatures.

The interaction region, in which the X-ray generation takes place, is provided in a vacuum chamber. For X-ray generation in the context of the present invention, a pressure of at most $10^{-3}$ mbar is preferably sought. The low pressure requirement is primarily due to the electron beam system. For some elaborate electron beam systems, still higher vacuum pressures could potentially be acceptable.

In an advantageous embodiment, the method further includes damping of pressure pulses which the high-pressure pump may excite in the liquid metal. It is known that many displacement-type pumps—including single- or multi-headed piston pumps and diaphragm pumps—do not expel the pressurized medium in a continuous manner, and this is an obstacle to providing a uniform liquid-metal jet. Damping of pressure pulses can be achieved using a pulsation damper of suitable type. For example, the damper may be a diaphragm accumulator, a bladder accumulator or a piston accumulator. A diaphragm accumulator may comprise a volume of gas that can be compressed by a pressure pulse in the liquid metal. The gas is then typically enclosed behind a diaphragm with its other side in contact with the liquid metal contained in the system. The gas may also be provided at a closed top end of a vertical pipe partially filled with the liquid metal and in free communication with the rest of the system. Alternatively, the damper can be a compliant section, adapted to elastically flex and absorb pressure pulses, of the duct connecting the high-pressure pump and the nozzle in the flow direction. Other kinds of pressure pulse dampers may also be conceived.

Many X-ray sources comprising a liquid target suffer to some extent from contamination by debris emanating from the target material, in the present case metal, which is distributed in the vacuum chamber in the form of vapor, mist and splashes. In order to reduce the production of such debris, an advantageous embodiment of the inventive method provides collection of the liquid metal by letting the ejected jet impinge on a slanting surface. The slanting surface deflects any splashes away from the vacuum chamber and towards the collection reservoir.

In some implementations of the inventive system, the liquid metal may be passed through one or more filters during its circulation in the system. For example, a relatively coarse filter may be arranged between the collection reservoir and the high-pressure pump in the normal flow direction, and a relatively fine filter may be arranged between the high-pressure pump and the nozzle in the normal flow direction. The coarse and the fine filter may be used separately or in combination. Embodiments including filtering of the liquid metal are advantageous in so far as solid contaminants are captured and can be removed from the circulation before they cause damage to other parts of the system.

According to a second aspect of the invention, there is provided a circulation system for supplying a liquid-metal electron target for X-ray generation. An X-ray source comprising such circulation system is also provided.

BRIEF DESCRIPTION OF THE DRAWINGS

Embodiments of the present invention will now be described in detail with reference to the accompanying drawings, on which.

On the drawings, similar parts or details are generally indicated by similar reference numerals throughout.

DETAILED DESCRIPTION OF EMBODIMENTS

Figure 1:
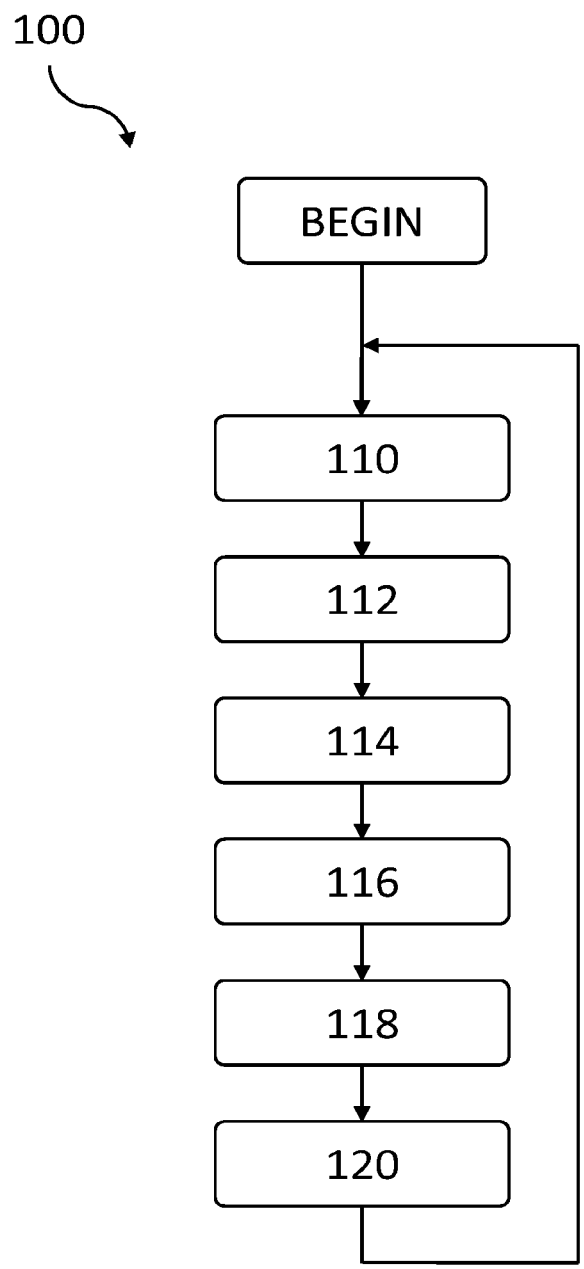
FIG. 1 is a flow chart of a method for closed-loop supply of liquid metal according to an embodiment of the invention.

A method 100 for closed-loop supply of liquid metal, in accordance with a currently preferred embodiment of the invention, will now be described with reference to FIG. 1. For clarity and simplicity of this disclosure, the method will be described in terms of 'steps'. It is emphasized that 'steps' are not necessarily processes that are delimited in time or separate from each other, and more than one 'step' may be performed at the same time in a parallel fashion. The intended outlook of this disclosure is that the 'steps' represent the different treatments that a liquid undergoes during its loop through a circulation system adapted to perform the method.

Figure 3:
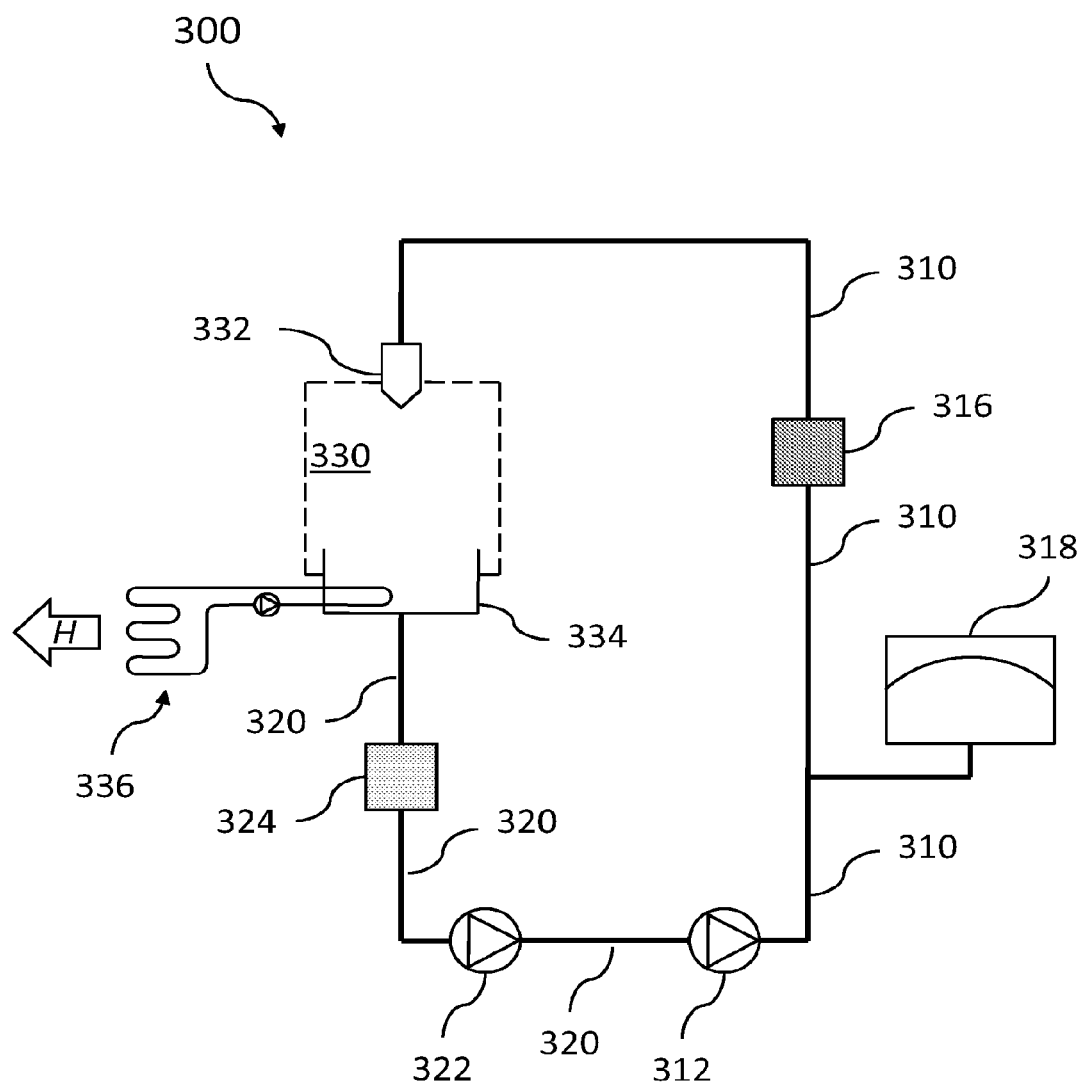
FIG. 3 schematically shows an alternative embodiment of the circulation system outlined in FIG. 2.

In step 110, the pressure of the liquid metal is raised to a high pressure. The high pressure should be sufficient in order for the liquid metal jet to obtain a high propagation speed in the vacuum chamber once injected from the nozzle. Typically, the high pressure will be at least 10 bar, preferably at least 50 bar and up to more than 100 bar. With reference to FIG. 3, the liquid metal that is being pressurized is accommodated in a closed-loop circulation system 300 comprising a high-pressure pump 312, preferably a diaphragm pump or other high-pressure pump. The pump constitutes a transition to a first portion 310 (high pressure portion) of the circulation system 300.

In step 112, the pressurized liquid metal is conducted through the high pressure portion 310 of the system 300 towards a nozzle 332. Hence, the high pressure portion 310 of the circulation system is located between the high-pressure pump 312 and the nozzle 332. The pressurized liquid metal will lose some pressure during its transportation from the pump 312 to the nozzle 332 in step 112, but the pressure is kept sufficiently high in order for the metal to reach the nozzle at a sufficiently high pressure of at least 10 bar, and typically at least 50 bar. In this embodiment, the pressurized liquid metal is passed through an optional fine filter 316 before it reaches the nozzle 332. The fine filter 316 may be provided in the form of a stainless-steel sieve or several consecutive sieves.

Depending on the nature of the high-pressure pump 312, pressure pulses propagating in the pressurized liquid metal may occur as a side effect of the pressurization. Such pressure pulses may be damped in an optional third step 114 using a damper 318 provided in the first portion of the system 310, before or after the fine filter 316. The damper may comprise a membrane having an amount of gas (such as compressed $N_2$) enclosed behind it. On the arrival of a pressure pulse at the damper 318, the liquid-side pressure increases, the membrane extends and compresses the gas. As the pressure sinks back, the gas expands again to its former volume. In effect, any residual pulse propagating onwards past the damper 318 towards the nozzle 332 has a reduced amplitude. For clarity of FIG. 3, a connection line has been drawn from the first portion 310 of the circulation system and the damper 318. Nevertheless, a damper of a similar kind may be arranged directly, in-line, in the first portion 310 of the system and/or have the form of an enlarged duct segment having as wall a flexible membrane supported by a compressed gas volume, as described above. In embodiments where a stronger damping is required, multiple dampers may be provided in the first portion 310.

In step 116, the liquid metal is ejected by the nozzle 332 into a vacuum chamber 330. The steady (spatially continuous) liquid-metal jet may then be used as a target for an electron beam (not shown) in this chamber 330. The electron beam impacts the liquid metal in an interaction region (not shown), and part of the electron beam energy is converted into X-rays. The nozzle orifice to be used has such shape and dimensions that the ejected liquid metal assumes the form of a physically continuous jet. The jet will tend to relax into a state of lower surface energy and thereby typically change its shape. As explained above, jet breakup into a spray, droplets or other kinds of discontinuous portions beyond the point where the electron beam impacts the metal jet can be tolerated, since any influence on the X-ray generation of such late breakup is negligible. Likewise, gravitation will have very little influence on the shape of the jet, which does not have to be parallel with the gravitational field. Suitably, the nozzle is a sapphire plate or ruby plate, through which a cylindrical or conical hole has been provided. The diameter of the hole may be of the same order as the thickness of the plate. The shape of the nozzle should minimize production of liquid-metal mist, which may contaminate the vacuum chamber 330. The desired cross-section of the jet, with regard to optimal X-ray generation conditions, may be taken as a starting point in dimensioning the nozzle. In the preferred implementation, the pressure of the liquid metal at the nozzle is about 100 bar. The nozzle has an ejection orifice that is 100 μm in diameter, which is similar to the wall thickness of the sapphire nozzle. A suitable electron beam for impact upon the liquid metal jet has a focus of about 20 μm diameter, and a power of about 200 W. Having read and understood the present disclosure, the skilled person will rely on routine calculations and experiments to find suitable parameters.

In step 118, the ejected liquid metal is collected in a collection reservoir 334. As already discussed above, the liquid metal may need to be cooled in order to avoid overheating of the system. Typically, the temperature of the liquid metal in the reservoir should preferably be maintained at a temperature slightly above the melting temperature, and may vary as a function of the melting point of the metal, the kind of metal used, the thermal insulation of the system 300 and the heat resistance of its components. Cooling may be effected by a heat-conducting circuit 336 which expels the excess heat H outside the system. If the heat conduction between the reservoir 334 and the outside of the system is large, a passive heat-conducting circuit may provide sufficient cooling. If more powerful cooling is required, one may use active refrigeration including compression of a cooling medium. In a preferred embodiment, the cooling is effected using water-cooled aluminum blocks which are clamped to the reservoir and/or the conduits.

In the interest of reducing contamination of the vacuum chamber 330, care is taken in order that the collection of the liquid-metal jet produces as little debris as possible. It has been found that the collection of the liquid metal progresses in a regular, non-chaotic and not very splashing fashion if the jet is conducted into the collection reservoir 334 via a slanting surface. The slanting surface may be an inner wall of the reservoir 334 or a plate arranged in proximity of the liquid-metal surface during steady-state operation of the circulation system 300. Best debris-preventing results have been achieved using a slanting surface at 45 degrees or less with respect to the metal jet. The slanting surface may be as steep as 10 degrees or even less. Moreover, the liquid-metal surface may be covered by a screen comprising an entry aperture for the jet; such screen is adapted to capture mist and splashes and prevent these from contaminating the vacuum chamber 330.

As a further step 120, in order to provide good working conditions for the high-pressure pump 312, the pressure of the collected liquid metal is raised to an inlet pressure for the high-pressure pump. This step takes place in a second portion 320 of the system 300 located between the collection reservoir 334 and the suction side of the high-pressure pump 312. In this embodiment, the pressure rise is effected actively by means of a primer pump 322. For a high-pressure pump in the form of a diaphragm metering pump as used in the preferred implementation, the inlet pressure to the high-pressure pump should be at least 0.1 bar, preferably at least 0.2 bar.

A coarse mechanical filter 324, such as a stainless-steel filter, may optionally be provided upstream of the primer pump 322 to protect it from potentially harmful solid contaminants.

As the liquid metal is again pressurized to at least 10 bar by the high-pressure pump 312, it has completed a loop in the system 300. The steps described above will now be repeated in a continuous fashion, so that a steady supply of liquid metal to the interaction region is achieved in the closed-loop system.

A preferred metal for use in the method above is an alloy comprising 95 wt % of Ga and 5 wt % of In, having a melting point of 25° C. and a freezing point of about 16° C. Other conceivable metals for use in the method are Galinstan™, which is an alloy comprising 68.5 wt % Ga, 21.5 wt % In and 10 wt % Sn, having a melting and freezing point of about −19° C.; an alloy comprising 66 wt % In and 34 wt % Bi, having a melting and freezing point of about 72° C.; and pure In having a melting and freezing point of about 157° C.

In the following, an apparatus according to the present invention will be described in detail, with reference to the accompanying drawings and particularly FIGS. 3, 4 and 5 thereof.

An apparatus according to the present invention in the form of a closed-loop circulation system 300 for liquid metal is schematically shown in FIG. 3 as a block diagram. The apparatus comprises a vacuum chamber 330 in which an electron beam (not shown) is to impact upon the liquid metal target jet in order to produce X-ray radiation by bremsstrahlung and characteristic line emission. A nozzle 332 is provided at the vacuum chamber for generating the liquid metal target jet. The nozzle is operatively connected to a high-pressure pump 312 through a pipe or conduit system. The portion 310 of the closed-loop circulation system between the nozzle and the high-pressure pump constitutes a high pressure portion (first portion) in which pressurized liquid metal is transported towards the nozzle 332 in order to be ejected as the liquid metal target jet. In the high pressure portion 310 of the circulation system, there may optionally be provided a damper 318. The purpose of such damper 318 is to reduce any pressure pulses in the pipe system caused by the high-pressure pump 312, in order for the generation of the liquid metal target jet at the nozzle 332 to be smooth and continuous. In addition, the high pressure portion 310 of the circulation system may comprise a filter, such as the fine filter indicated at 316, for removing any fine particles that may otherwise clog or hamper the nozzle 332.

Figure 2:
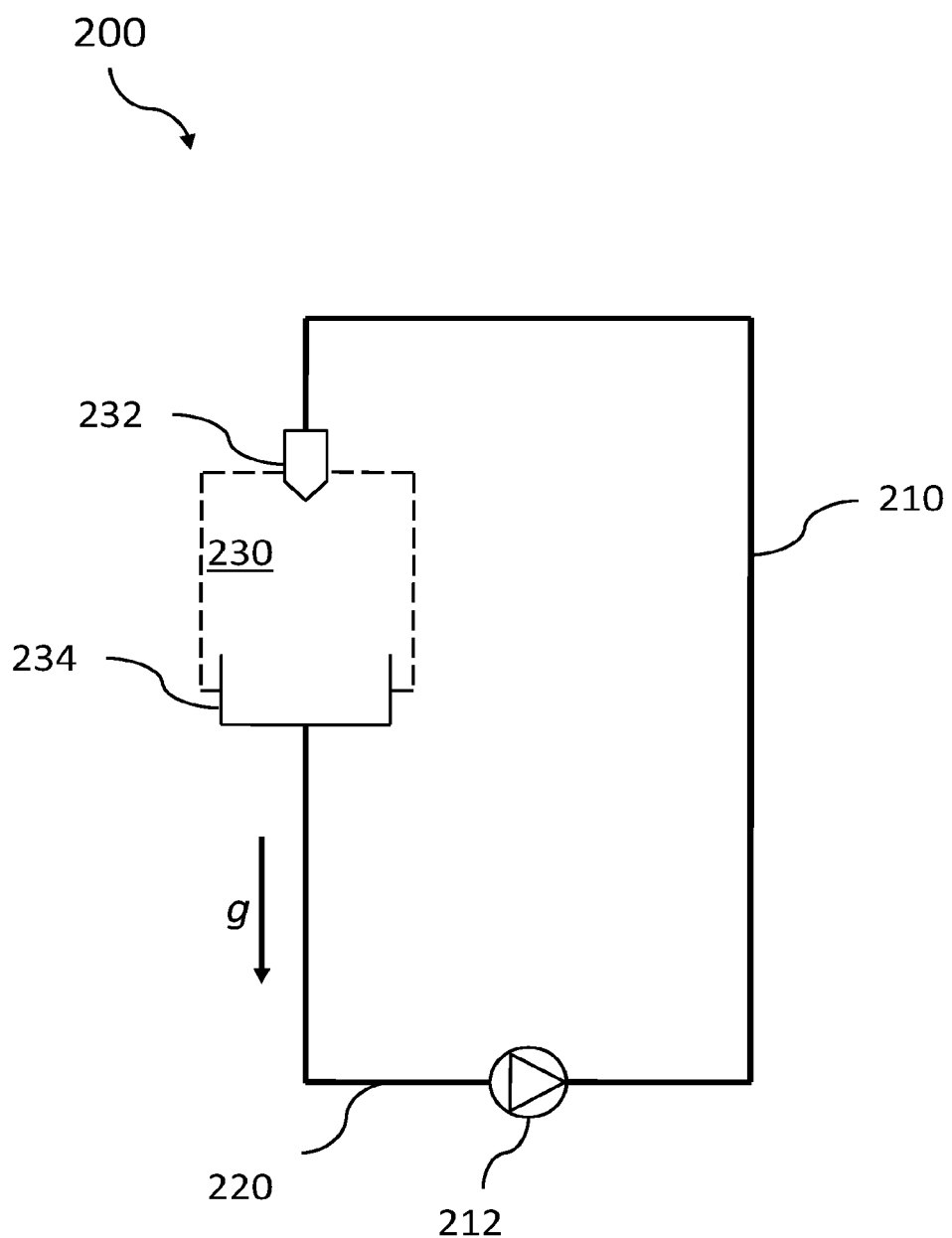
FIG. 2 is a diagrammatic overview of the inventive circulation system for providing a liquid metal target for X-ray generation by electron beam impact.

The high-pressure pump 312 works from a second portion 320 of the closed-loop circulation system, in which the pressure of the liquid metal is considerably lower than in the high pressure portion 310. At the inlet side of the high-pressure pump, the pressure of the liquid metal should have a suitable inlet pressure. A primer pump 322 is provided in the second portion of the circulation system for raising the pressure of the liquid metal from the low pressure present at the vacuum chamber to a suitable inlet pressure. Typically, the inlet pressure at the inlet side of the high-pressure pump is at least 0.1 bar, more preferably at least 0.2 bar. The second portion of the pipe system 320 connects the high-pressure pump 312 to a collection reservoir 334. After having been ejected in the form of a target jet by the nozzle 332, and after having passed the vacuum chamber, the liquid metal is collected in the collection reservoir 332 for further recirculation, and the primer pump 322 raises the pressure to a suitable inlet pressure for the high-pressure pump 312. In alternative embodiments, as shown in FIG. 2, the primer pump 322 can be dispensed with if other means for raising the pressure to a suitable inlet pressure for the high-pressure pump is provided. For example, a sufficient inlet pressure for the high-pressure pump 212 can be obtained by arranging the high-pressure pump 212 at such position that a column of liquid metal is present above the pump 212. In other words, the high-pressure pump 212 is located lower in the gravitational field than the collection reservoir 234 and the hydrostatic pressure caused by the column of liquid metal provides a sufficient inlet pressure.

An optional filter, such as a coarse filter 324, may be provided in the fluid path of the liquid metal between the collection reservoir 334 and the high-pressure pump 312 for removing particulate contamination in the liquid metal.

When an electron beam impacts the liquid metal target jet inside the vacuum chamber, a large amount of heat is deposited in the liquid metal. In order to remove excess heat, a cooling system 336 may be provided in connection with the collection reservoir. In the preferred embodiment, the cooling system comprises one or more water cooled blocks clamped to the pipe system close to the collection reservoir. The water cooled blocks can be aluminum blocks having channels for the cooling water.

Some examples of suitable metals are given above. The temperature control of the metal within the closed-loop circulation system is preferably such that the temperature of the metal is maintained slightly above the melting point for the metal at issue. Of course, the temperature of the metal immediately after having its interaction with the electron beam will be considerably higher until the cooling in connection with the collection reservoir has had its effect. However, for the other portions of the circulation system, the temperature of the metal is best kept moderate. One reason for keeping the metal temperature at moderate levels is that the metal may become aggressive to the piping material and other parts of the system at high temperatures.

It should also be noted that some metals used in connection with the present invention may require that heat is supplied at some portions in order to maintain the metal liquid at all times during operation of the system. This may, for example, mean that a heater can be added at the high-pressure portion of the circulation system. Moreover, supply of heat is often required during start-up of the system when the metal used is not liquid at ambient (room) temperatures.

Figure 4:
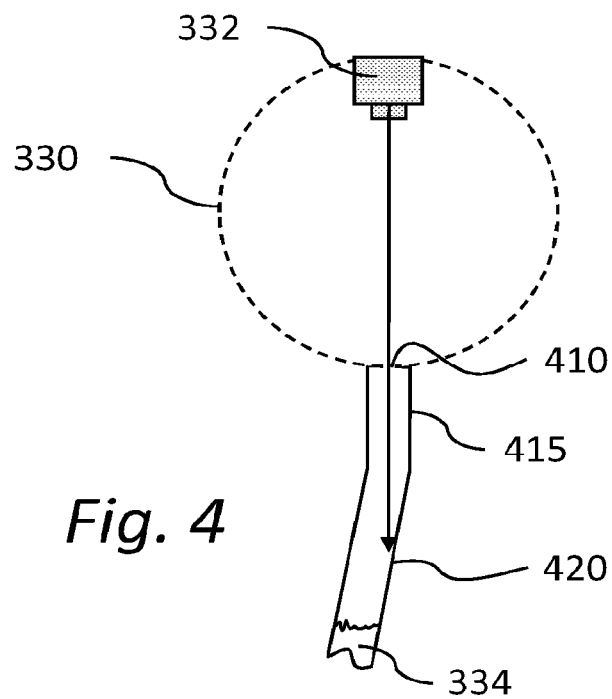
FIG. 4 schematically illustrates a first implementation of the liquid metal collection reservoir.
Figure 5:
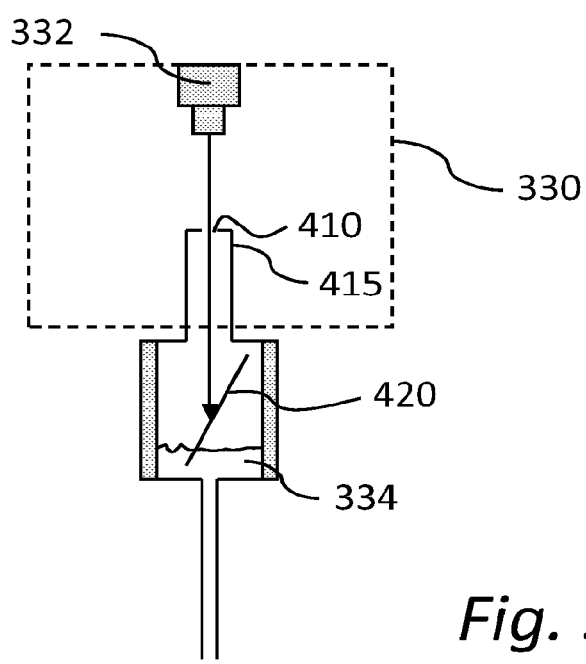
FIG. 5 schematically illustrates a second implementation of the liquid metal collection reservoir.

FIGS. 4 and 5 are two examples of how the liquid metal collection could be effected. It should be noted that FIGS. 4 and 5 are highly schematic and only illustrate the general principles. In FIGS. 4 and 5, the liquid metal jet is schematically indicated by the downwards-pointing arrows.

As described above, care should be taken when collecting the liquid metal jet in order to avoid or reduce formation of debris (splashes, mist, etc.) in the vacuum chamber. To this end, there is provided a slanting surface that the liquid metal jet hits before the liquid metal is collected. In one embodiment, the slanting surface as well as the collection reservoir is part of the pipe system, as schematically shown in FIG. 4. In the embodiment shown in FIG. 4, the outlet from the vacuum chamber is designed such that the liquid metal jet exits the vacuum chamber through an opening 410, continues some distance through a straight portion of an exit pipe 415, and eventually hits a slanting portion 420 of the piping.

Thereby, the risk of splashes, mist or other debris finding its way back into the vacuum chamber 330 is considerably reduced. In order to further reduce the risk of debris in the vacuum chamber, the exit opening 410 from the vacuum chamber may be provided with an aperture in order to reduce the physical opening between the vacuum chamber and the piping. The collection reservoir 334 is in this case constituted by the lower part of the exit pipe from the vacuum chamber, as indicated in FIG. 4.

As an alternative, the straight portion 415 of the piping may be located within the general region of the vacuum chamber, as schematically shown in FIG. 5. It is also conceivable that the collection reservoir has the form of a container. If the piping itself or the container lacks a natural slanting surface for the liquid metal jet to hit after its passage through the vacuum chamber, the slanting surface may be provided in the form of a plate or a cone or similar, which is also schematically shown in FIG. 5.

Figure 6:
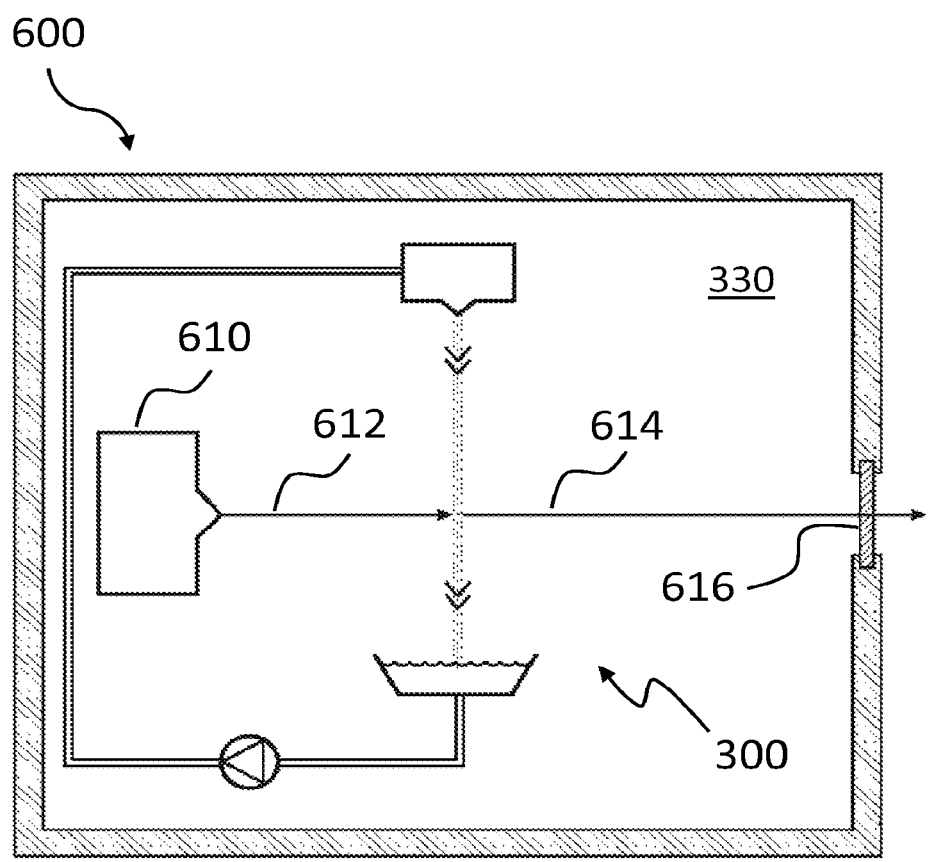
FIG. 6 schematically shows an X-ray source comprising a closed-loop circulation system for liquid metal according to the present invention.

The present invention also relates to an X-ray source which comprises a closed-loop circulation system for liquid metal according to the above. Such X-ray source is schematically shown in FIG. 6. The X-ray source 600 comprises, in addition to the closed-loop liquid metal circulation system 300, an electron source 610 for generating an electron beam 612. The electron beam is to interact with the liquid metal jet to generate, preferably by bremsstrahlung and characteristic line emission, X-ray radiation. The generated X-ray radiation propagates as indicated by the arrow 614 towards an X-ray window 616, through which the X-ray radiation exits the vacuum chamber 330. In FIG. 6, the vacuum chamber is shown to enclose both the circulation system 300 and the electron beam source 610. However, it may be preferred to have e.g. circulation pumps and some of the piping for the liquid metal outside the vacuum chamber. Also, the electron source 610 is only shown very schematically, and will in any implementation normally have some parts located outside of the vacuum chamber.

The invention claimed is:

1. A method for closed-loop supply of liquid metal to an interaction region, in which an electron beam is to impact upon the liquid metal to generate X rays, comprising the steps of:
   raising a pressure of the liquid metal in a first portion of a closed-loop circulation system to at least 10 bar using a high-pressure pump;
   conducting the liquid metal at a pressure of at least 10 bar to a nozzle;
   ejecting the liquid metal from the nozzle into a vacuum chamber, in which the interaction region is located, for generating a liquid metal jet propagating through the vacuum chamber at 10 m/s or more;
   collecting the ejected liquid metal in a collection reservoir;
   raising a pressure of the collected liquid metal to an inlet pressure suitable for the high-pressure pump, said inlet pressure being at least 0.1 bar; and
   repeating the above steps to effect supply of liquid metal to the interaction region in a closed loop,
   wherein a collection reservoir with an aperture and a slanting surface that the metal jet hits is used to collect the ejected liquid metal in order to reduce contamination of the vacuum chamber by liquid-metal splashes, mist and the like from the collection reservoir,
   wherein the liquid metal is passed through at least one filter on its passage from the collection reservoir to the high-pressure pump and/or on its passage from the high-pressure pump to the nozzle, and wherein the at least one filter is a coarse filter disposed between the collection reservoir to the high-pressure pump and/or the at least one filter is a fine filter disposed between the high-pressure pump and the nozzle, and the method comprises:

i) passing the liquid metal through the coarse filter on its passage from the collection reservoir to the high-pressure pump; and/or ii) passing the liquid metal through the fine filter on its passage from the high-pressure pump to the nozzle.

2. The method of claim 1, wherein the inlet pressure is at least 0.2 bar.

3. The method of claim 1, wherein the liquid metal jet is spatially continuous during its propagation through the vacuum chamber from the nozzle up to a point where the electron beam is to impact upon the liquid metal jet.

4. The method of claim 1, further comprising the step of damping pressure pulses in the liquid metal in said first portion of the closed-loop circulation system.

5. The method of claim 1, wherein the step of raising the pressure using the high-pressure pump comprises raising the pressure to at least 50 bar.

6. The method of claim 1, wherein the step of raising the pressure of the collected liquid metal to the inlet pressure comprises locating the high-pressure pump lower in the gravitational field than the reservoir.

7. The method of claim 1, wherein the step of raising the pressure of the collected liquid metal to the inlet pressure comprises using a primer pump.

8. A closed-loop circulation system for supply of liquid metal to an interaction region in which an electron beam is to impact upon the liquid metal to generate X-rays, comprising:

a high-pressure pump connected to a first side of a high-pressure portion of the circulation system;

a nozzle connected to a second side of the high-pressure portion of the circulation system;

a vacuum chamber for receiving liquid metal ejected in the form of a jet from the nozzle, wherein said jet propagates through the vacuum chamber at 10 m/s or more;

a collection reservoir for collecting the liquid metal after passing the vacuum chamber; and means, located between the vacuum chamber and the high-pressure pump in the flow direction of the liquid metal, for raising a pressure of the liquid metal to at least 0.1 bar in order to provide an inlet pressure for the high-pressure pump, wherein the pressure of the liquid metal in the high-pressure portion of the circulation system is at least 10 bar, wherein the collection reservoir is provided with an aperture and a slanting surface that the metal jet hits in order to reduce contamination of the vacuum chamber by liquid-metal splashes, mist and the like from the collection reservoir, wherein the system comprises at least one filter for removing particular contamination from the circulating liquid metal, and wherein the at least one filter comprises:

i) a fine filter arranged between the high-pressure pump and the nozzle in the flow direction of the liquid metal; and/or ii) a coarse filter arranged between the collection reservoir and the high-pressure pump in the flow direction of the liquid metal.

9. The circulation system of claim 8, wherein the inlet pressure is at least 0.2 bar.

10. The circulation system of claim 8, further comprising a damper for dampening of pressure pulses in the liquid metal caused by the high-pressure pump.

11. The circulation system of claim 8, wherein the aperture of the collection reservoir is an aperture in an exit opening from the vacuum chamber, said aperture being designed and structured to reduce risk of debris entering the vacuum chamber from the collection reservoir.

12. The circulation system of claim 8, wherein the means for raising the pressure of the liquid metal to at least 0.1 bar in order to provide an inlet pressure for the high-pressure pump has the form of a primer pump.

13. An X-ray source comprising an electron source and a closed-loop circulation system according to claim 8.

* * * * *